(12) United States Patent
Kim et al.

(10) Patent No.: US 11,991,902 B2
(45) Date of Patent: May 21, 2024

(54) DISPLAY DEVICE AND METHOD OF MANUFACTURING THE SAME

(71) Applicant: SAMSUNG DISPLAY CO., LTD., Yongin-si (KR)

(72) Inventors: Myung Hwan Kim, Yongin-si (KR); Suk Hoon Kang, Yongin-si (KR); Min Jae Kim, Yongin-si (KR); Hee Ra Kim, Yongin-si (KR); Beom Soo Shin, Yongin-si (KR); Hong Yeon Lee, Yongin-si (KR); Baek Kyun Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 109 days.

(21) Appl. No.: 17/737,983

(22) Filed: May 5, 2022

(65) Prior Publication Data

US 2022/0262880 A1    Aug. 18, 2022

Related U.S. Application Data

(62) Division of application No. 16/918,957, filed on Jul. 1, 2020, now Pat. No. 11,335,747, which is a division
(Continued)

(30) Foreign Application Priority Data

Jul. 6, 2017    (KR) .................... 10-2017-0086159

(51) Int. Cl.
*H10K 59/122*    (2023.01)
*H10K 50/11*    (2023.01)
(Continued)

(52) U.S. Cl.
CPC ......... *H10K 59/122* (2023.02); *H10K 59/173* (2023.02); *H10K 71/00* (2023.02);
(Continued)

(58) Field of Classification Search
CPC .... H10K 59/122; H10K 59/173; H10K 71/00; H10K 71/135; H10K 71/621;
(Continued)

(56) References Cited

U.S. PATENT DOCUMENTS

| 5,952,037 A | 9/1999 | Nagayama et al. |
| 6,373,453 B1 | 4/2002 | Yudshaka |

(Continued)

FOREIGN PATENT DOCUMENTS

| CN | 103839964 A | 6/2014 |
| JP | 2001-351781 A | 12/2001 |

(Continued)

OTHER PUBLICATIONS

Extended European Search Report dated Jan. 22, 2019, Corresponding Application No. EP 18162428.9.
(Continued)

*Primary Examiner* — Thanhha S Pham
(74) *Attorney, Agent, or Firm* — Lewis Roca Rothgerber Christie LLP

(57) ABSTRACT

A display device includes a bank including an opening exposing a surface of a base. The bank further includes side surfaces adjacent to an upper surface. The side surfaces slope downward from the upper surface toward an opening in an organic film pattern. A plurality of fine holes is formed on the upper surface and the side surfaces, the bank may also include a plurality of inner holes.

6 Claims, 30 Drawing Sheets

Related U.S. Application Data of application No. 15/867,882, filed on Jan. 11, 2018, now Pat. No. 10,770,523.

(51) Int. Cl.
| | |
|---|---|
| *H10K 50/813* | (2023.01) |
| *H10K 50/822* | (2023.01) |
| *H10K 59/12* | (2023.01) |
| *H10K 59/173* | (2023.01) |
| *H10K 71/00* | (2023.01) |
| *H10K 71/13* | (2023.01) |

(52) U.S. Cl.
CPC ......... *H10K 71/135* (2023.02); *H10K 71/621* (2023.02); *H10K 50/11* (2023.02); *H10K 50/813* (2023.02); *H10K 50/822* (2023.02); *H10K 59/1201* (2023.02)

(58) Field of Classification Search
CPC .... H10K 50/11; H10K 50/813; H10K 50/822; H10K 59/1201; H10K 59/10; H10K 50/805; H10K 59/123; H01L 21/77; H01L 21/0274
See application file for complete search history.

(56) References Cited

U.S. PATENT DOCUMENTS

| | | | |
|---|---|---|---|
| 6,380,672 B1 | 4/2002 | Yudshaka | |
| 6,642,651 B2 | 11/2003 | Yudshaka | |
| 6,727,513 B2 | 4/2004 | Fujimori et al. | |
| 6,755,983 B2 | 6/2004 | Yudshaka | |
| 6,806,504 B2 | 10/2004 | Park | |
| 6,830,494 B1 | 12/2004 | Yamazaki et al. | |
| 6,838,192 B2 | 1/2005 | Miyashita et al. | |
| 6,911,773 B2 | 6/2005 | Seki | |
| 7,012,367 B2 | 3/2006 | Seki | |
| 7,015,503 B2 | 3/2006 | Seki | |
| 7,115,434 B2 | 10/2006 | Yamazaki et al. | |
| 7,214,959 B2 | 5/2007 | Seki et al. | |
| 7,273,801 B2 | 9/2007 | Seki et al. | |
| 7,291,970 B2 | 11/2007 | Kuwabara | |
| 7,307,381 B2 | 12/2007 | Ito et al. | |
| 7,662,425 B2 | 2/2010 | Miyashita et al. | |
| 7,781,963 B2 | 8/2010 | Yoshida et al. | |
| 8,008,860 B2 | 8/2011 | Yoshida et al. | |
| 8,018,152 B2 | 9/2011 | Yamazaki et al. | |
| 8,067,265 B2 | 11/2011 | Zheng et al. | |
| 8,339,039 B2 | 12/2012 | Yamazaki et al. | |
| 8,431,182 B2 | 4/2013 | Kimura et al. | |
| 8,580,333 B2 | 11/2013 | Kimura et al. | |
| 8,592,239 B2 | 11/2013 | Fennimore et al. | |
| 8,643,270 B2 | 2/2014 | Yamazaki et al. | |
| 8,753,801 B2 | 6/2014 | Saie et al. | |
| 9,735,212 B2 | 8/2017 | Pang | |
| 2003/0146695 A1 | 8/2003 | Seki | |
| 2004/0079937 A1 | 4/2004 | Miyazawa | |
| 2005/0214577 A1 | 9/2005 | Sakamoto et al. | |
| 2006/0289872 A1 | 12/2006 | Miyazawa | |
| 2007/0159433 A1 | 7/2007 | Choi | |
| 2009/0096371 A1 | 4/2009 | Matsudate et al. | |
| 2010/0052519 A1 | 3/2010 | Jeon et al. | |
| 2010/0238386 A1 | 9/2010 | Yin et al. | |
| 2011/0175073 A1 | 7/2011 | Chang | |
| 2013/0228801 A1 | 9/2013 | Lee | |
| 2014/0042402 A1 | 2/2014 | Prushinskiy et al. | |
| 2014/0087312 A1 | 3/2014 | Kim et al. | |
| 2014/0139102 A1 | 5/2014 | Jeon et al. | |
| 2016/0155784 A1* | 6/2016 | Park .................. H10K 50/854 438/23 |
| 2017/0309693 A1 | 10/2017 | Pang | |
| 2018/0254310 A1 | 9/2018 | Jeon et al. | |

FOREIGN PATENT DOCUMENTS

| | | | |
|---|---|---|---|
| JP | 2007-095379 A | 4/2007 |
| JP | 2008-084740 A | 4/2008 |
| JP | 2009-140689 A | 6/2009 |
| JP | 2009-533809 A | 9/2009 |
| JP | 2011-34717 A | 2/2011 |
| JP | 2014-103424 A | 6/2014 |
| KR | 10-2011-0017779 A | 2/2011 |
| KR | 10-2011-0124331 A | 11/2011 |
| KR | 10-2014-0041315 A | 4/2014 |
| KR | 10-2015-0141338 A | 12/2015 |
| KR | 10-2016-0056705 A | 5/2016 |
| KR | 10-2014-0140147 A | 3/2017 |

OTHER PUBLICATIONS

EPO Extended European Search Report dated Nov. 12, 2020, issued in corresponding European Patent Application No. 20151854.5 (11 pages).

Svarnas, et al., Two-step in-situ RF plasma process for surface conditioning of organic electronic patterned substrates, 29th ICPIG, Jul. 12-17, 2009, Cancun, Mexico, pp. D13.

Tuteja, et al., Designing Superoleophobic Surfaces, Science, vol. 318, Dec. 7, 2007, pp. 1618-1622.

* cited by examiner

DISPLAY DEVICE AND METHOD OF MANUFACTURING THE SAME

CROSS-REFERENCE TO RELATED APPLICATIONS

This application is a divisional of U.S. patent application Ser. No. 16/918,957, filed Jul. 1, 2020, which application is a divisional of U.S. patent application Ser. No. 15/867,882, filed Jan. 11, 2018, now U.S. Pat. No. 10,770,523, which claims priority to and the benefit of Korean Patent Application No. 10-2017-0086159, filed Jul. 6, 2017, the entire content of all of which is incorporated herein by reference.

BACKGROUND

1. Field

One or more embodiments described herein relate to a display device and a method for manufacturing a display device.

2. Description of the Related Art

An organic light emitting display is a self-luminous display. Unlike a liquid crystal display, an organic light emitting display does not require a backlight and therefore is used in various electric/electronic products, such as but not limited to smartphones and ultrathin televisions.

One technique for forming an organic light emitting layer for such a display involves ejecting organic ink containing organic light emitting material to pixel areas. The organic ink may be ejected using a solution coating method (e.g., inkjet printing). The ejected organic ink is then dried. However, when the organic ink is ejected or sprayed to the pixel areas, the ink may overflow onto a pixel defining layer and/or other pixel areas. This may have an adverse effect on display quality or performance.

In an attempt to prevent such a phenomenon, a method for increasing repellency of the surface of the pixel defining layer has been proposed. The aim of this technique is to prevent liquid from being stained on the pixel defining layer. However, the pixel defining layer is not sufficiently repellant to control the organic ink, and thus the propose method has proven to be ineffective.

SUMMARY

In accordance with one or more embodiments, a display device includes a base; a bank on the base and including an opening exposing a surface of the base; and an organic film pattern in the opening on the base, wherein the bank includes side surfaces adjacent to an upper surface, the side surfaces sloping downward from the upper surface toward the opening, and wherein the bank includes a plurality of fine holes on the upper surface and the side surfaces and a plurality of inner holes in the bank.

A cross-section of at least one of the fine holes may include a portion of a circular shape. A surface of the bank may have a repellant property. The bank may include a plurality of inorganic particles having inner holes. The inorganic particles may include at least one of silica ($SiO_2$), alumina ($Al_2O_3$), and zinc oxide (ZnO). The surface of the bank may include a fluoro group.

The display device may include a plurality of pixels, wherein the base may include a substrate and a first electrode in each of the pixels on the substrate, the bank may be a pixel defining layer for the pixels, and the opening of the bank may expose at least a portion of the first electrode in each of the pixels. The organic film pattern may include an organic light emitting material. The display device may include a second electrode on the organic film pattern.

In accordance with one or more other embodiments, a method of manufacturing a display device may include forming an electrode on a base substrate; forming a photoresist pattern on the base substrate, the photoresist pattern including a plurality of inorganic particles having inner holes and an opening exposing at least a portion of the electrode; and forming a plurality of fine holes on a surface of the photoresist pattern by partially removing inorganic particles in the surface of the photoresist pattern, wherein partially removing the inorganic particles includes etching a surface of the photoresist pattern using a fluorinated gas to expose the inner holes in the inorganic particles.

The inorganic particles may include at least one of silica ($SiO_2$), alumina ($Al_2O_3$), and zinc oxide (ZnO). The surface of the photoresist pattern may include a fluoro group. A cross-section of at least one of the fine holes may include a portion of a circular shape.

The method may include ejecting an organic ink onto the electrode exposed by the opening, the organic ink including an organic light emitting material; and forming an organic layer by drying the ejected organic ink. The method may include removing residues of the photoresist pattern on the electrode through plasma ashing before etching the surface of the photoresist pattern using the fluorinated gas after the forming of the photoresist pattern.

In accordance with one or more other embodiments, a display device may include a base; a bank on the base and including an opening exposing a surface of the base; and a fine pattern layer in contact with a surface of the bank, wherein an area of a portion of the fine pattern layer which is in contact with the bank is smaller than the total area of a surface of the fine pattern layer which faces the bank. The fine pattern layer may include one or more of silicon oxide ($Si_xO_y$), silicon nitride ($Si_xN_y$), and silicon oxynitride ($Si_xO_yN_z$).

The display device may include a plurality of pixels, wherein the base may include a substrate and a pixel electrode in each of the pixels on the substrate, the bank may be a pixel defining layer for the pixels, and the opening of the bank may expose at least a portion of the pixel electrode in each of the pixels. The pixel defining layer may have a color that blocks light transmission. The display device may include an organic layer on the pixel electrode exposed by the opening, wherein the organic layer includes an organic light emitting material.

In accordance with one or more other embodiments, a pixel includes a first layer; a second layer on a first layer, wherein the second layer includes an opening and a first surface adjacent to the opening, the first surface including a plurality of holes and material including a fluoro group element. The first surface may have recessed surfaces corresponding to the holes, and the recessed surfaces may include the fluoro group element. The second layer may include a second surface adjacent the first surface, and the second surface may be at an angle relative to the first surface and including a portion of the holes. The second layer may be a pixel defining layer, and the opening may be in the second layer is to emit light. The pixel may include an organic film pattern on the first layer and in the opening.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
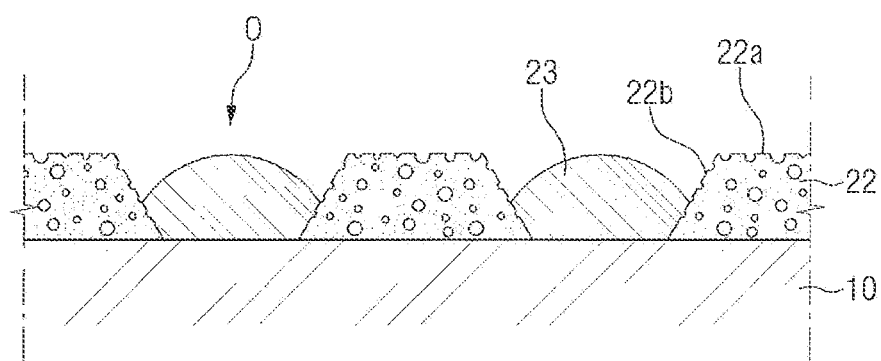
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates a cross-sectional view of an embodiment of a display device which includes a bank 22 on a base 10 and an organic film pattern 23 between portions of the bank 22. The base 10 may provide a space in which the bank 22 and the organic film pattern 23 are disposed and may support the bank 22 and the organic film pattern 23. In an exemplary embodiment, the base 10 may be a support substrate including wirings, electrodes, semiconductors, insulating films, and/or other features for driving the display device.

Each of a plurality of openings O expose a surface of the base 10. The openings O may be defined in the bank 22, and the organic film pattern 23 may be in respective ones of the openings O on the base 10.

The bank 22 may include an upper surface 22a which is a flat surface and side surfaces 22b which are inclined surfaces. The upper surface 22a of the bank 22 may be parallel to the surface of the base 10. The side surfaces 22b of the bank 22 may be connected to the upper surface 22a and may slope downward from the upper surface 22a toward the openings O. The side surfaces 22b of the bank 22 may connect the upper surface 22a and the surface of the base 10.

The upper surface 22a and/or the side surfaces 22b of the bank 22 may be flat surfaces. In one embodiment, the upper surface 22a and/or the side surfaces 22b of the bank 22 may not be flat surfaces, e.g., at least part of the upper surface 22a and/or the side surfaces 22b of the bank 22 may include a curved surface.

The upper surface 22a and the side surfaces 22b of the bank 22 are a relative concept, e.g., a surface located relatively higher based on FIG. 1 may be referred to as the upper surface 22a and surfaces located relatively lower may be referred to as the side surfaces 22b. A boundary between the upper surface 22a and the side surfaces 22b may be set at a predetermined manner or location, for example, based on the above relative criterion and taking the substantial shape of the bank 22 formed by an actual manufacturing process into consideration.

In an exemplary embodiment, a cross-section of the bank 22 may have a mound shape including a continuous curve. In this case, the boundary between the upper surface 22a and the side surfaces 22b may be set to an arbitrary position. In addition, a surface that is higher than the boundary may be the upper surface 22a, and surfaces lower than the boundary may be the side surfaces 22b. In one embodiment, the upper surface 22a and the side surfaces 22b may be arranged in a different manner.

The bank 22 may include a plurality of inner holes and a plurality of fine holes on its surface. The fine holes may be disposed in recessed surfaces of the bank 22. A maximum diameter of each of the inner holes and the fine holes may be, for example, but is not limited to about 50 to 100 nm.

A cross-section of at least one of the inner holes may have a predetermined (e.g., circular) shape. A cross-section of at least one of the fine holes may include a portion of a predetermined (e.g., circular) shape. The term "circular shape" may include not only the same shape as a circle, but also a polygon substantially close to a circle, an ellipse, a closed curve, or a shape having at least one curved portion in consideration of a manufacturing process.

The bank 22 may include an organic material such as an acrylic compound, polyimide (PI), benzocyclobutane (BCB), or perfluorocyclobutane (PFCB). The bank 22 may further include inorganic particles having micro- or nano-scale inner holes. The inorganic particles may be mixed with the organic material or may be dispersed in the organic material. The inorganic particles may be one or more of, for example, hollow silica ($SiO_2$), hollow alumina ($Al_2O_3$), and hollow zinc oxide (ZnO). Different kinds of particles may be used in another embodiment, as long as the particles include micro- or nano-scale inner holes.

When the bank 22 includes inorganic particles having micro- or nano-scale inner holes, the inner holes formed in the bank 22 may be the inner holes of the inorganic particles. The fine holes on the surface of the bank 22 may be fine holes formed, for example, by partially removing some of the inorganic particles to expose the inner holes inside the inorganic particles.

The surface of the bank 22 may include, for example, a fluoro group (F). The fluoro group may be included not only in a portion of the surface of the bank 22 where no fine holes are formed, but also in inner walls of the fine holes. In an exemplary embodiment, the content (or concentration) of the fluoro group may be higher in the portion of the surface where the fine holes are not formed than in the inner walls of the fine holes.

The bank 22 may be, but is not limited to, a pixel defining layer which defines a plurality of pixels in the organic light emitting display device. The organic film pattern 23 is a layer including an organic material and may be, but is not limited to, an organic ink or solution including an organic light emitting material. The bank 22 may be highly repellant due to the fine holes and the fluoro group formed on its surface. Therefore, the organic film pattern 23 may be easily formed in each opening O between the portions of the bank 22.

Hereinafter, an embodiment in which the structures of the bank 22 and the organic film pattern 23 described above are applied to an organic light emitting display device will be described. In this case, the bank 22 may be a pixel defining layer, and the organic film pattern 23 may be an organic layer including an organic light emitting material.

Figure 2:
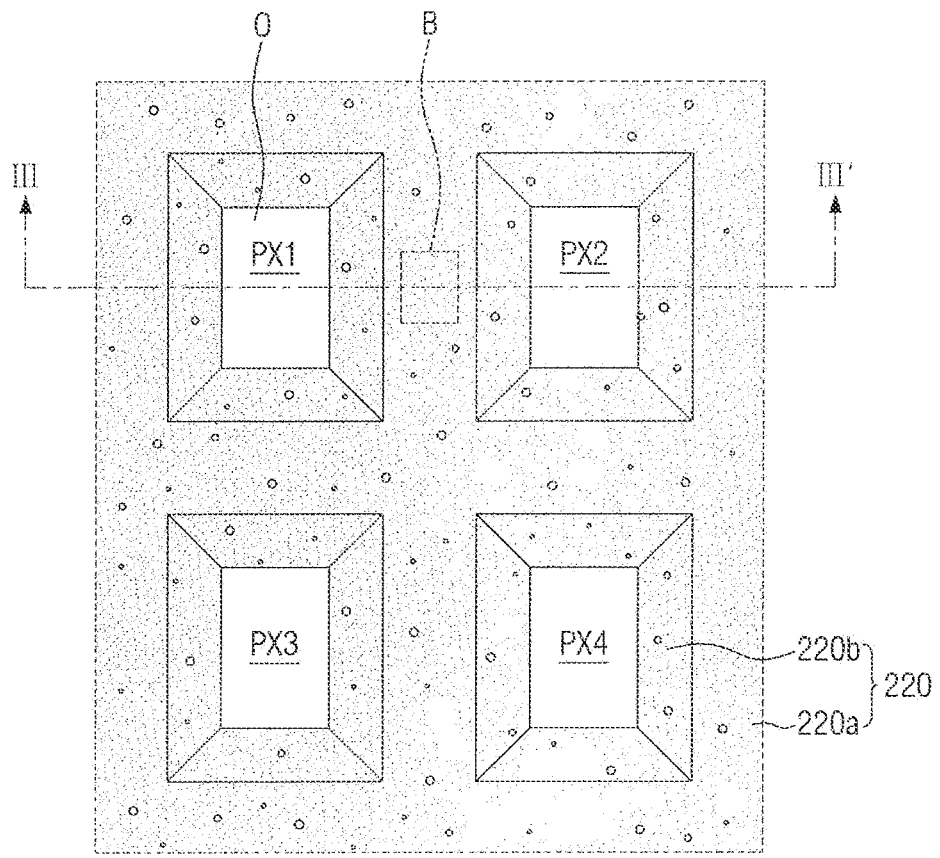
FIG. 2 illustrates an embodiment of a pixel defining layer.

FIG. 2 illustrates a plan view of a pixel defining layer 220 of an organic light emitting display device. Referring to FIG. 2, the organic light emitting display device includes a plurality of pixels PX1 through PX4 arranged in a matrix shape when seen from above.

The pixel defining layer 220 is a layer disposed around the pixels PX1 through PX4, and an opening O in the pixel defining layer 220 may define each of the pixels PX1 through PX4.

The pixel defining layer 220 may include an upper surface 220a which is a flat surface and side surfaces 220b which are inclined surfaces. The side surfaces 220b may extend from the opening O toward the upper surface 220a and may be connected to the upper surface 220a. Each of the side surfaces 220b may slope such that one end on the side of the upper surface 220a is higher than the other end on the side of the opening O. Each of the side surfaces 220b may have a substantially constant slope. However, the slope of each of the side surfaces 220b may vary, for example, according to position in another embodiment. The side surfaces 220b may surround each of the pixels PX1 through PX4.

Figure 3:
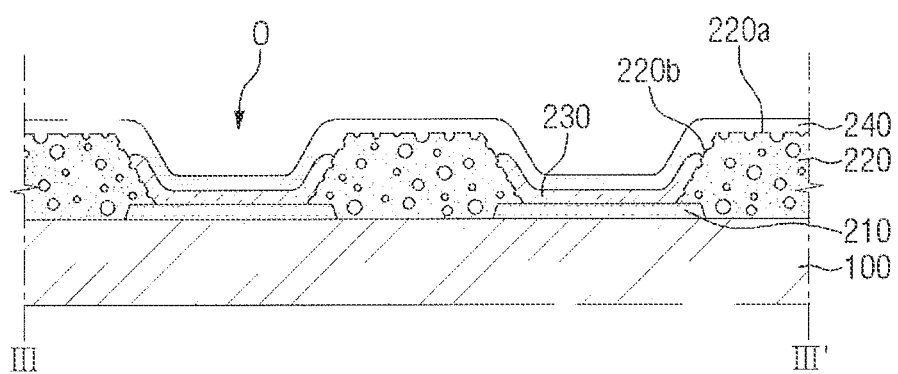
FIG. 3 illustrates a cross-sectional view taken along line III-III' in FIG. 2.
Figure 4:
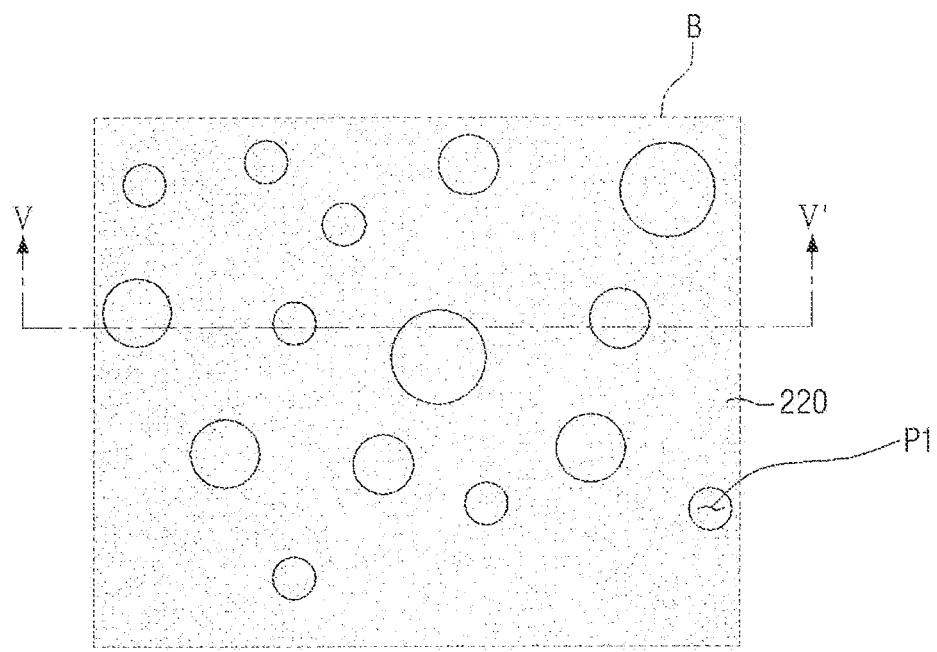
FIG. 4 illustrates an enlarged view of a portion B in FIG. 2.
Figure 5:
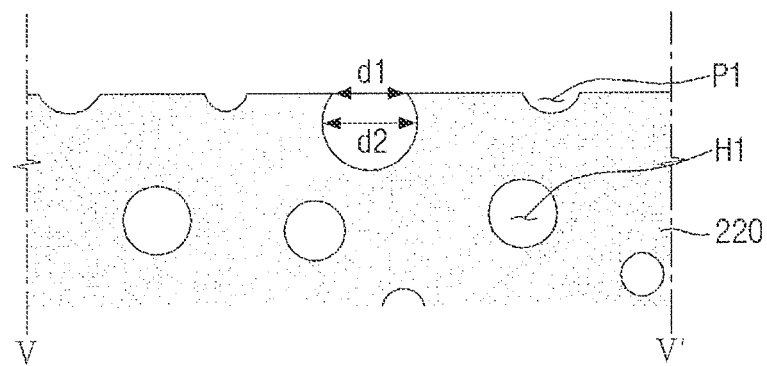
FIG. 5 illustrate a cross-sectional view taken along line V-V' in FIG. 4.

FIG. 3 illustrates a cross-sectional view taken along line of FIG. 2. FIG. 4 illustrates an enlarged view of a portion B in FIG. 2. FIG. 5 illustrates a cross-sectional view taken along line V-V' of FIG. 4. In FIG. 3, other components of the organic light emitting display device as well as the pixel defining layer 220 are illustrated.

Referring to FIGS. 3, 4, and 5, the organic light emitting display device includes a base substrate 100, a first electrode 210, the pixel defining layer 220, an organic layer 230, and a second electrode 240. The base substrate 100 may be a support substrate of the organic light emitting display device and may include wirings, electrodes, semiconductors, insulating films, and/or other features for driving the organic light emitting display device.

The first electrode 210 may be on the base substrate 100. The first electrode 210 may be in an area corresponding to each pixel defined by the opening O of the pixel defining layer 220. The first electrode 210 may be a pixel electrode or an anode of the organic light emitting display device.

The first electrode 210 may include a conductive material having a high work function. For example, the first electrode 210 may include transparent conductive oxide (TCO) such as indium tin oxide (ITO), indium zinc oxide (IZO), zinc oxide (ZnO), or indium oxide ($In_2O_3$). In one embodiment, the first electrode 210 may include a stack of a transparent conductive oxide layer made of any one of the above examples and a conductive material layer made of a reflective metal, e.g., lithium (Li), calcium (Ca), aluminum (Al), silver (Ag), magnesium (Mg), or aurum (Au).

A fluorine compound may remain on a surface of the first electrode 210. The surface of the first electrode 210 may include, for example, a fluoro group element.

The pixel defining layer 220 is on the base substrate 100 and defines a plurality of pixels (e.g., PX1 to PX4) of the organic light emitting display device when seen from above. The pixel defining layer 220 may surround the first electrode 210 in each pixel. The opening O exposing at least a portion of the first electrode 210 may be defined in the pixel defining layer 220. A portion of the pixel defining layer 220 may cover a portion of the first electrode 210.

The pixel defining layer 220 may include the upper surface 220a which is a flat surface and the side surfaces 220b which are inclined surfaces. The upper surface 220a of the pixel defining layer 220 may be parallel to an upper surface and/or a lower surface of the base substrate 100 and may be higher than the surface of the first electrode 210 in a vertical direction. The side surfaces 220b of the pixel defining layer 220 may slope upward from the opening O toward the upper surface 220a and may connect the surface of the first electrode 210 and the upper surface 220a of the pixel defining layer 220.

The pixel defining layer 220 includes a plurality of inner holes H1 and a plurality of fine holes P1 on its surface. A maximum diameter of each of the inner holes H1 and the fine holes P1 may be, but is not limited to, about 50 to 100 nm. A cross-section of at least one of the inner holes H1 may have a predetermined (e.g., circular) shape. A cross-section of at least one of the fine holes P1 may include a portion of a predetermined (e.g., circular) shape.

At least some of the fine holes P1 may have a shape in which the cross-sectional area of the entrance is smaller than the maximum cross-sectional area of the inside, e.g., a diameter d1 of the entrance is less than a maximum diameter d2 of each of the fine holes P1. The fine holes P1 may be formed on the upper surface 220a and the side surfaces 220b of the pixel defining layer 220. In one embodiment, the fine holes P1 may also be formed on only one of the upper surface 220a and the side surfaces 220b. The fine holes P1 may be arranged randomly or in a predetermined pattern.

The pixel defining layer 220 may include an organic material such as an acrylic compound, PI, BCB, or PFCB. In one embodiment, the pixel defining layer 220 may be an organic layer formed by developing a photoresist material.

The pixel defining layer 220 may further include inorganic particles having micro- or nano-scale inner holes. The inorganic particles may be mixed with the above organic material or may be dispersed in the organic material. The inorganic particles may be one or more of, for example, hollow silica, hollow alumina, and hollow zinc oxide. In another embodiment, one or more different types of particles may be used as long as the particles include micro- or nano-scale inner holes.

When the pixel defining layer 220 includes inorganic particles having micro- or nano-scale inner holes, the inner holes H1 in the pixel defining layer 220 may be the inner holes of the inorganic particles. The fine holes P1 on the surface of the pixel defining layer 220 may be fine holes formed by partially removing some of the inorganic particles to expose the inner holes inside the inorganic particles.

The pixel defining layer 220 may have a color that blocks light transmission. Thus, the pixel defining layer 220 may function as a light shielding layer. For example, the pixel defining layer 220 may have a color that substantially blocks the transmission of visible light, such as black, gray or white. Thus, the pixel defining layer 220 may prevent light from transmitting through the pixel defining layer 220 and leaking out. To this end, the pixel defining layer 220 may further include a black pigment, dye or paint, or may further include carbon black.

The surface of the pixel defining layer 220 may include a fluoro group (F), In one embodiment, the pixel defining layer 220 may include an organic material having an unsaturated bond. When the surface of the pixel defining layer 220 is etched by a fluorinated gas made into plasma, fluorine may bond to at least a portion of the organic material in the surface of the pixel defining layer 220.

The fluoro group may be included not only in a portion of the surface of the pixel defining layer 220 where the fine holes P1 are not formed, but also in inner walls of the fine holes P1. In an exemplary embodiment, the content of the fluoro group may be higher in the portion of the surface where the fine holes P are not formed than in the inner walls of the fine holes P1.

The fluoro group may also be included in a small predetermined amount in the surface of the first electrode 210. However, since the surface of the pixel defining layer 220 has the fine holes P1, it may be far more repellant than the surface of the first electrode 210.

The organic layer 230 may be on the first electrode 210 exposed by the opening O. The organic layer 230 may be formed by ejecting an organic ink containing an organic light emitting material into the opening O using a solution coating method, such as inkjet printing and drying the ejected organic ink.

The fine holes P1 on the surface of the pixel defining layer 220 may accommodate air or a gas. Accordingly, the contact area between the surface of the pixel defining layer 220 and the organic ink may be reduced, thereby improving the repellency of the surface of the pixel defining layer 220. In addition, the fluoro group in the surface of the pixel defining layer 220 may further improve the repellency of the surface of the pixel defining layer 220, thus making the surface of the pixel defining layer 220 super-repellant. As a result, the organic ink ejected into the opening O on the first electrode 210 may easily be positioned within the opening O without overflowing to the surface of the pixel defining layer 220 or invading the opening O of another pixel area.

In one embodiment, the organic layer 230 may be a multilayer including a light emitting layer and one or more of a hole injection layer, a hole transport layer, an electron transport layer, and an electron injection layer. In this case, each layer in the organic layer 230 may be formed sequentially through ejecting and drying processes and may be easily formed in the opening O of a desired pixel area due to the repellant surface of the pixel defining layer 220.

The second electrode 240 may be on the organic layer 230 and may partially or entirely cover the surface of the pixel defining layer 220. The second electrode 240 may include a conductive material having a low work function. For example, the second electrode 240 may include a metal such as Li, Ca, LiF/Ca, LiF/Al, Al, Mg, Ag, Pt, Pd, Ni, Au, Nd, Ir, Cr, BaF, Ba, Yb or a compound or mixture of these metals, or may include a transparent conductive material such as ITO, TCO, IZO, ZnO or $In_2O_3$. The second electrode 240 may be a common electrode or a cathode of the organic light emitting display device.

In one embodiment, the organic light emitting display device may further include a capping layer or a protective layer which prevents foreign matter or moisture from penetrating into the organic layer 230.

Figure 6:
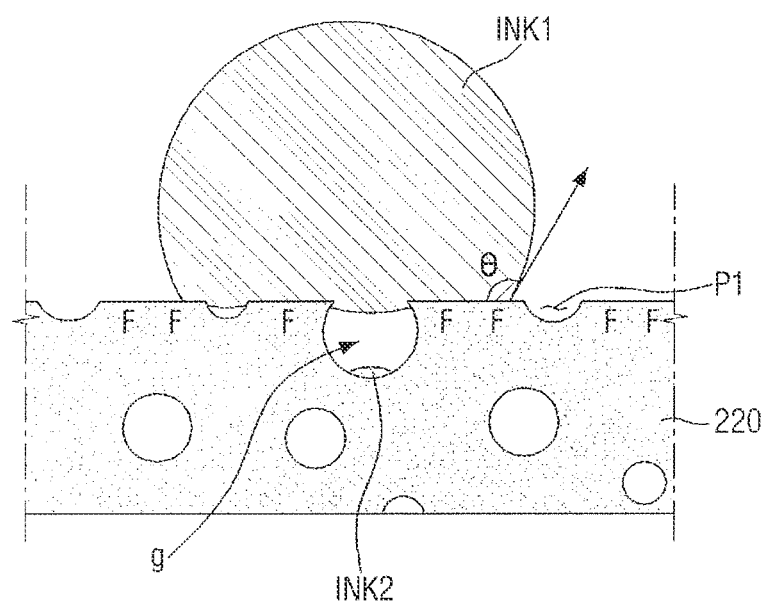
FIG. 6 illustrates a state in which organic ink is in contact with the surface of a pixel defining layer according to an embodiment.

FIG. 6 illustrates a state in which an organic ink INK1 is in contact with the surface of the pixel defining layer 220 according to an embodiment.

Referring to FIG. 6, the surface of the pixel defining layer 220 and the organic ink INK1 may contact each other at a predetermined contact angle θ. The contact angle θ is an angle formed by the surface of the pixel defining layer 220 and a tangent to the organic ink INK1. The value of the contact angle θ increases as the repellency of the surface of the pixel defining layer 220 increases or as the surface tension of the surface of the pixel defining layer 220 decreases.

The surface of the pixel defining layer 220 may contain a small amount of air or gas g in the fine holes P1, Therefore, most of the space in each of the fine holes P may be filled with the air or the gas g, even though a small amount of the organic ink INK2 may flow into the fine holes P1, Consequently, the contact area between the surface of the pixel defining layer 220 and the organic ink INK1 is reduced, thus causing the surface of the pixel defining layer 220 more repellant to the organic ink INK1.

In addition, since the surface tension of the pixel defining layer 220 is lowered by the fluoro group, the repellency of the surface of the pixel defining layer 220 may be further improved. As a result, the contact angle θ of the surface of the pixel defining layer 220 with the organic ink INK1 may have a high value.

Therefore, after the pixel defining layer 220 is formed, if the organic ink INK1 is sprayed onto the opening O of a specific pixel using an inkjet nozzle, the organic ink INK1 may be positioned only in the opening O of the specific pixel without staining the surface of the pixel defining layer 220 or invading the opening O of another pixel.

When deionized water (DIW) is brought into contact with the surface of the pixel defining layer 220 instead of the organic ink INK1, the contact angle θ between the surface of the pixel defining layer 220 and the deionized water may be, for example, 120° or more.

Figure 7:
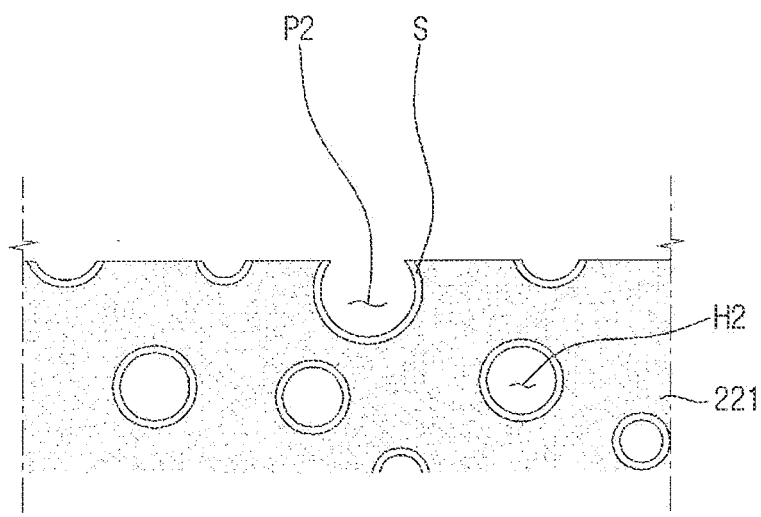
FIGS. 7-10 illustrate enlarged views of respective portions of pixel defining layers of organic light emitting display devices according to various embodiments.

FIG. 7 illustrates an enlarged view of a portion of a pixel defining layer 221 of an organic light emitting display device according to an embodiment. The embodiment illustrated in FIG. 7 may be the same as in FIG. 3, except that the pixel defining layer 221 further includes a shell S surrounding each of a plurality of fine holes P2 and a plurality of inner holes H2.

Referring to FIG. 7, the pixel defining layer 221 may further include the shell S surrounding each of the fine holes P2 and the inner holes H2. The shell S may be made of, for example, silica. The pixel defining layer 221 may include silica particles having inner holes H2, In this case, the shell S may be a silica portion, and the inner holes H2 in the pixel defining layer 221 may be the inner holes H2 of the silica particles.

Figure 8:
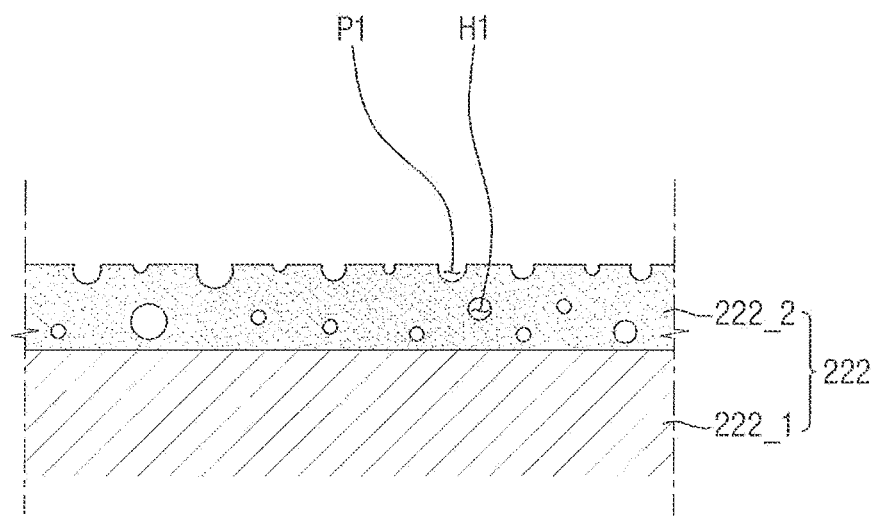

In addition, each of the fine holes P2 on the surface of the pixel defining layer 221 may be a fine hole formed by partially removing the silica shell S to expose an inner hole H2 inside the shell S. In this case, part of the shell S may be exposed on the surface of the pixel defining layer 221, and an inner wall of each of the fine holes P2 may be formed of the shell S, FIG. 8 illustrates an enlarged view of a portion of a pixel defining layer 222 of an organic light emitting display device according to an embodiment. The embodiment in FIG. 8 may be the same as in FIG. 3, except that the pixel defining layer 222 includes a first layer 222_1 which includes neither fine holes P1 nor inner holes H1 and a second layer 222_1 which includes a plurality of fine holes P1 and a plurality of inner holes H1.

Referring to FIG. 8, the pixel defining layer 222 includes the first layer 222_1 which includes neither the fine holes P1 nor the inner holes H1 and the second layer 222_1 which is stacked on the first layer 222_1 and includes the fine holes P1 and the inner holes H1. The first layer 222_1 may be made of only an organic material. The second layer 222_2 may be the same as the pixel defining layer 220 illustrated in FIG. 3.

Figure 9:
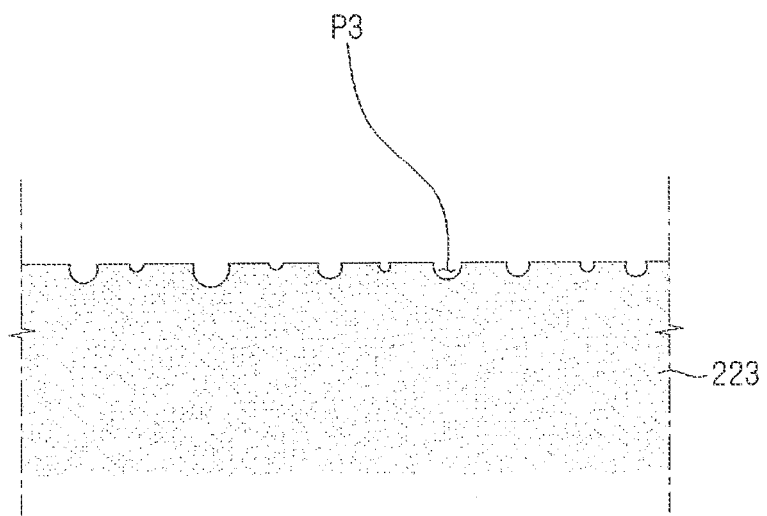

When the first layer 222_1 is formed using an organic material and the second layer 222_2 is formed as a layer having the fine holes P1 and the inner holes H1 as illustrated in FIG. 8, the repellency of the surface of the pixel defining layer 222 may be maintained. Also, damage to a first electrode 210 may be prevented in the process of forming each opening O by patterning the pixel defining layer 222, FIG. 9 illustrates an enlarged view of a portion of a pixel defining layer 223 of an organic light emitting display device according to an embodiment. The embodiment in FIG. 9 may be the same as in FIG. 3, except that no inner holes are formed in the pixel defining layer 223.

Referring to FIG. 9, a plurality of fine holes P3 may be formed only on the surface of the pixel defining layer 223, and no inner holes may be formed in the pixel defining layer 223. Thus, the internal density of the pixel defining layer 223 may increase, preventing penetration of air or moisture into the pixel defining layer 223.

Figure 10:
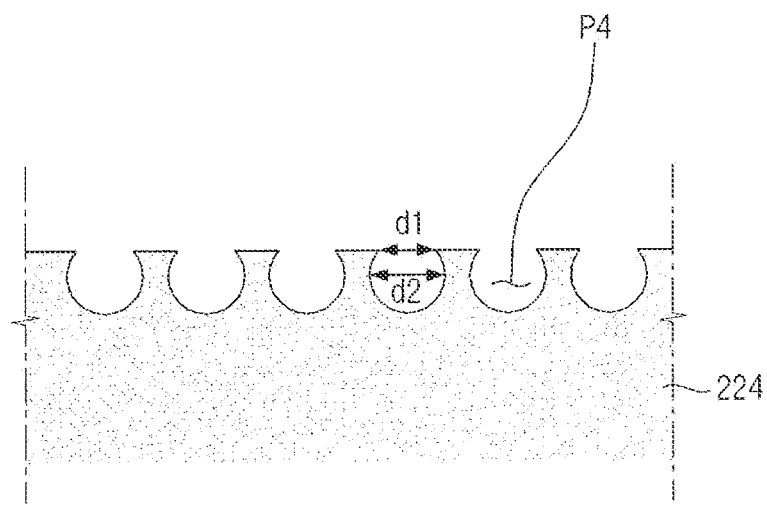

FIG. 10 illustrates an enlarged view of a portion of a pixel defining layer 224 of an organic light emitting display device according to an embodiment. The embodiment in FIG. 10 may be the same as in FIG. 9, except that fine holes P4 of the same size and shape are formed on the surface of the pixel defining layer 224.

Referring to FIG. 10, the fine holes P4 may have the same size and shape. For example, the diameter d1 of the entrance of each of the fine holes P4 may be less than the maximum diameter d2 of each of the fine holes P4. In this case, air or a gas may be effectively accommodated in the fine holes P4.

In FIG. 10, the cross-section of each of the fine holes P4 includes a portion of a circular shape. However, in another embodiment, the cross section of the fine holes P4 may have another shape, including but not limited to a polygonal shape that becomes wider toward the inside of the pixel defining layer 224. As used herein, the term "polygonal shape" may refer to not only the same shape as the polygonal shape, but also a closed curve substantially close to a polygon, a shape having at least one curved portion, etc., in consideration of a manufacturing process.

FIGS. 11-18 are cross-sectional views illustrating stages of an embodiment of a method for manufacturing a display device, which, for example, may be the organic light emitting display device of FIG. 3.

Figure 11:
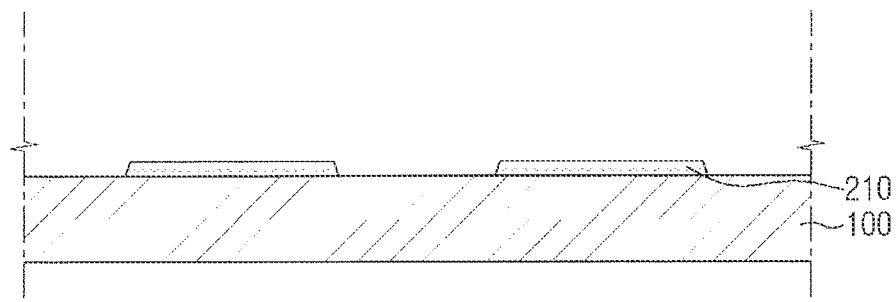
FIGS. 11-18 illustrate stages of an embodiment of a method for manufacturing a display device.

Referring to FIG. 11, a first electrode 210 is formed in each pixel on a base substrate 100.

Figure 12:
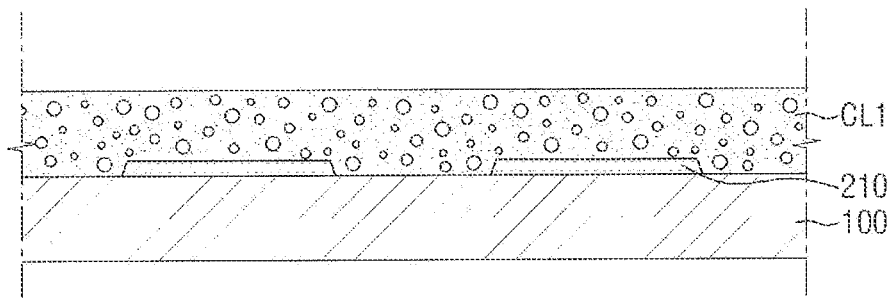

Referring to FIG. 12, a first photoresist layer CL1 is formed on the base substrate 100. The first photoresist layer CL1 may be formed on the entire surface of the base substrate 100 to completely cover the first electrode 210. The first photoresist layer CL1 may include inorganic particles having micro- or nano-scale inner holes.

Figure 13:
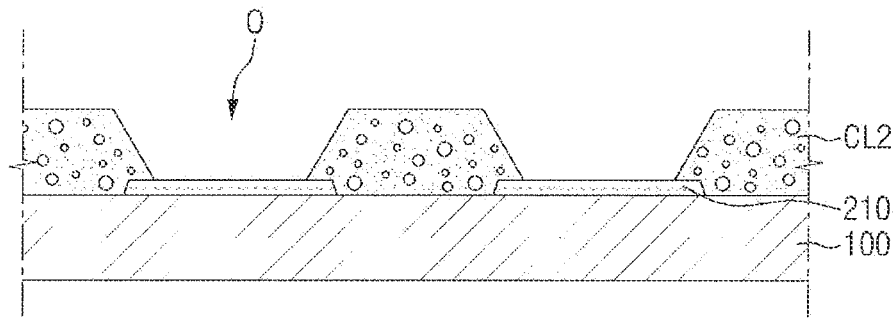

Referring to FIG. 13, the first photoresist layer CL1 is patterned to form a first photoresist pattern CL2 in which each opening O exposing the first electrode 210 is defined. At this time, residues of the first photoresist layer CL1 on the first electrode 210 may be removed, for example, by plasma asking.

Figure 14:
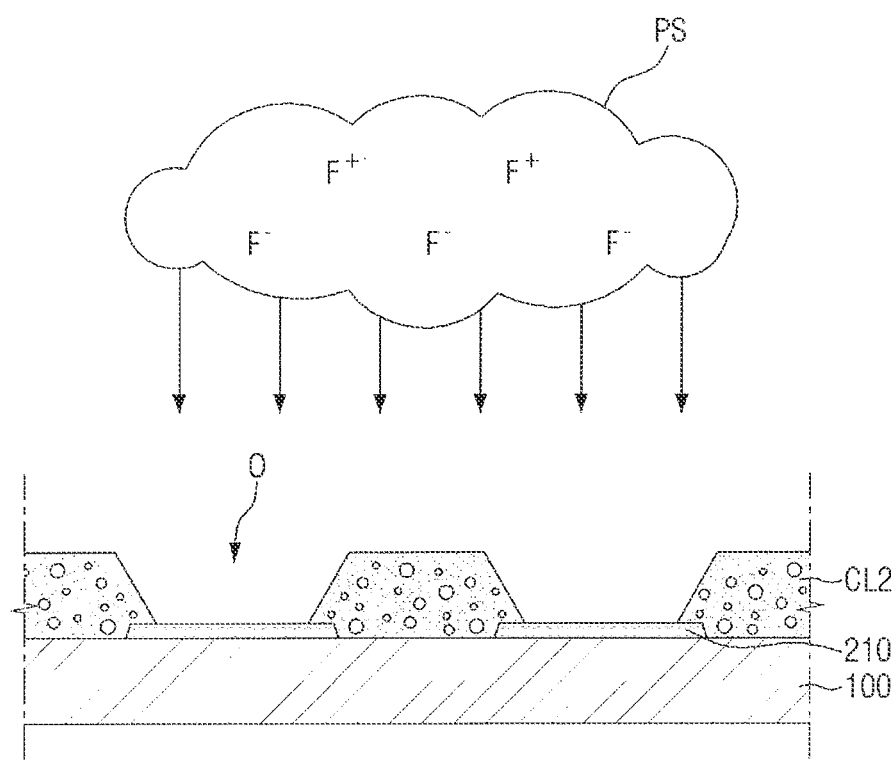
Figure 15:
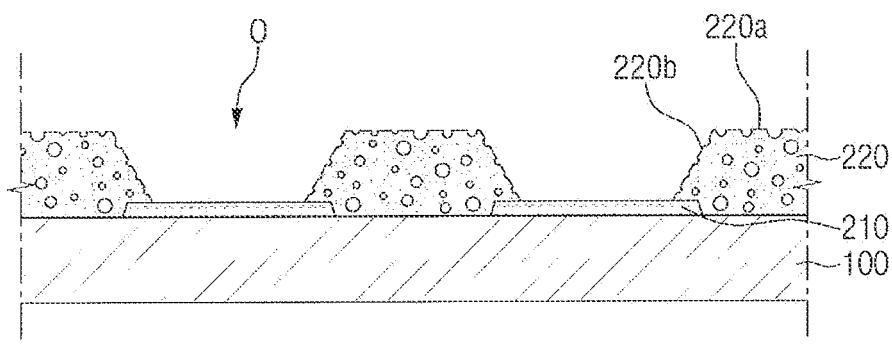

Referring to FIGS. 14 and 15, the surface of the first photoresist pattern CL2 is etched using a fluorinated gas PS made into plasma, thereby forming a pixel defining layer 220 having a plurality of fine holes P1 formed on its surface. As a surface layer of the first photoresist pattern CL2 is etched, inorganic particles close to the surface of the first photoresist pattern CL2 may be partially removed to expose inner holes H1 in the inorganic particles. As a result, the fine holes P1 may be formed on the surface of the pixel defining layer 220.

In addition, at least a portion of a carbon compound having an unsaturated bond in the surface of the first photoresist pattern CL2 or the pixel defining layer 220 may bond to fluorine atoms. Accordingly, a fluoro group may be included in the surface of the pixel defining layer 220.

Fluorinated gas PS introduced to etch the first photoresist pattern CL2 may also partially etch the surface of the first electrode 210. Accordingly, a fluorine compound may also remain on the surface of the first electrode 210. For example, the surface of the first electrode 210 may include the fluoro group. Accordingly, the repellency of the surface of the first electrode 210 may increase. However, since the surface of the pixel defining layer 220 is far more repellant than the surface of the first electrode 210, an organic light emitting ink INK may be positioned on the first electrode 210 rather than on the pixel defining layer 220.

Figure 16:
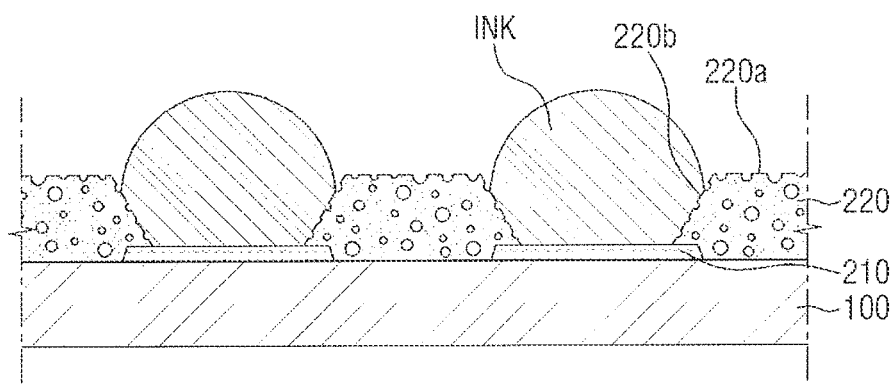

Referring to FIG. 16, the organic ink INK is ejected onto the first electrode 210 inside the opening O of each pixel. The organic ink INK may not flow over the pixel defining layer 220 due to the repellency of the surface of the pixel defining layer 220.

Figure 17:
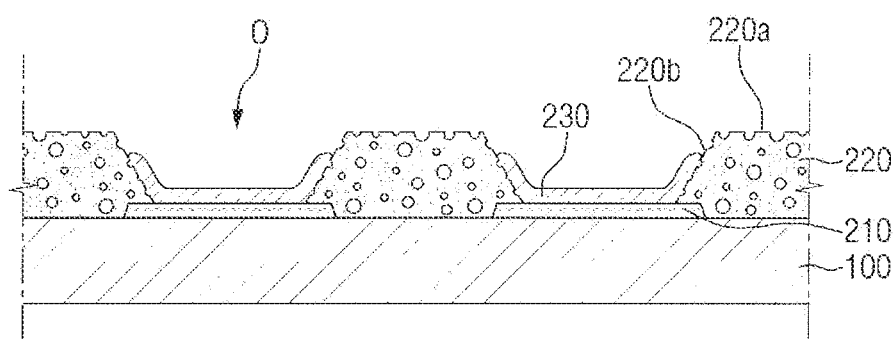

Referring to FIG. 17, the organic ink INK is dried to form an organic layer 230. For example, a solvent in the organic ink INK may be evaporated to leave only an organic light emitting material. The organic ink INK may be attached to the first electrode 210 as it is dried.

The organic layer 230 is a single layer in FIG. 17. In another embodiment, the organic layer 230 may be formed as a multilayer including a light emitting layer and one or more of a hole injection layer, a hole transport layer, an electron transport layer, and an electron injection layer. In this case, ink corresponding to each layer may be sequentially ejected and dried.

Figure 18:
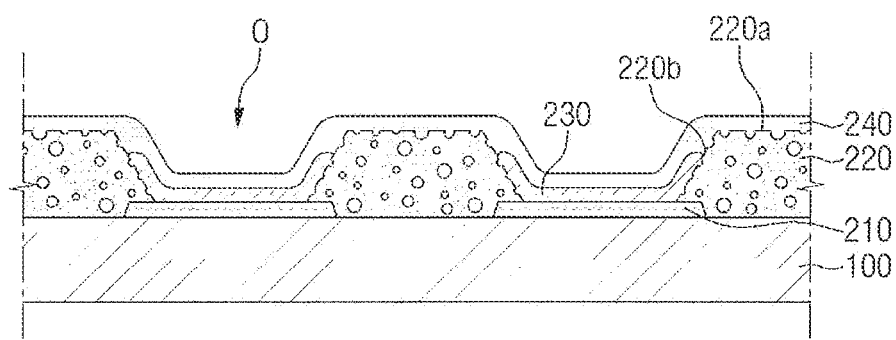

Referring to FIG. 18, a second electrode 240 is formed on the organic layer 230 and the pixel defining layer 220 to produce the organic light emitting display device illustrated in FIG. 3.

Figure 19:
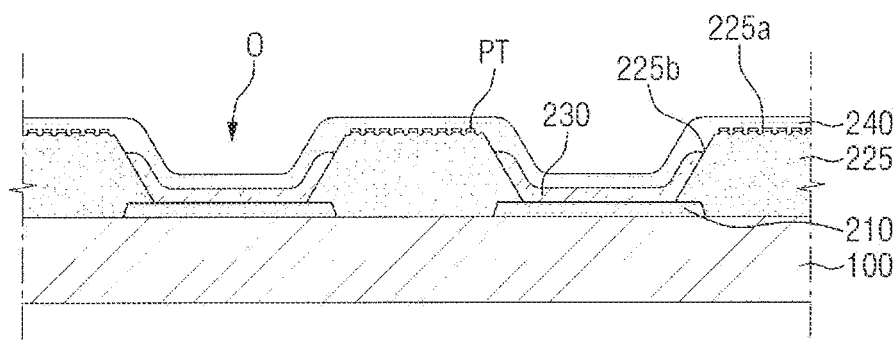
FIG. 19 illustrates an embodiment of an organic light emitting display device.
Figure 20:
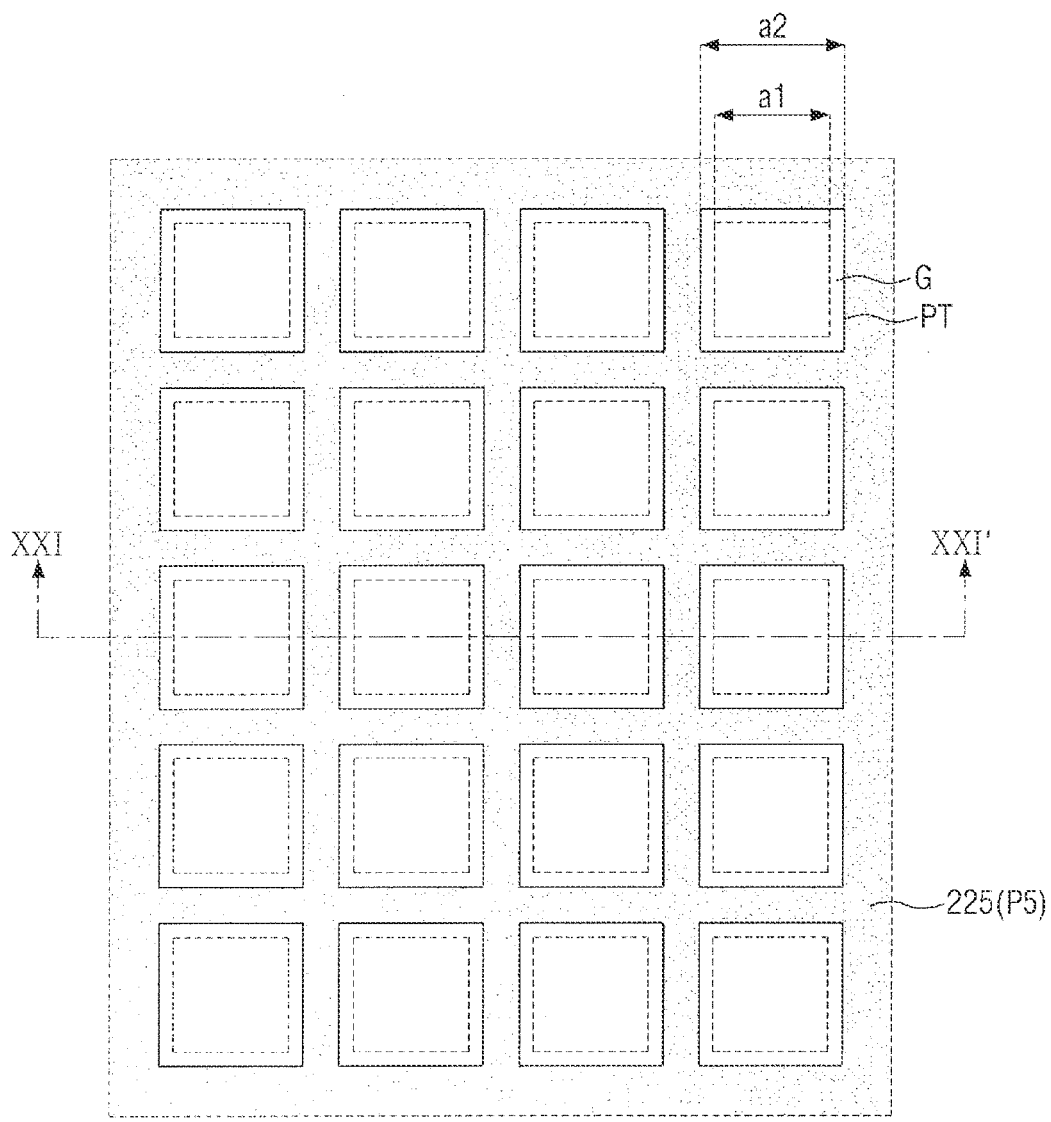
FIG. 20 illustrates another embodiment of a pixel defining layer.
Figure 21:
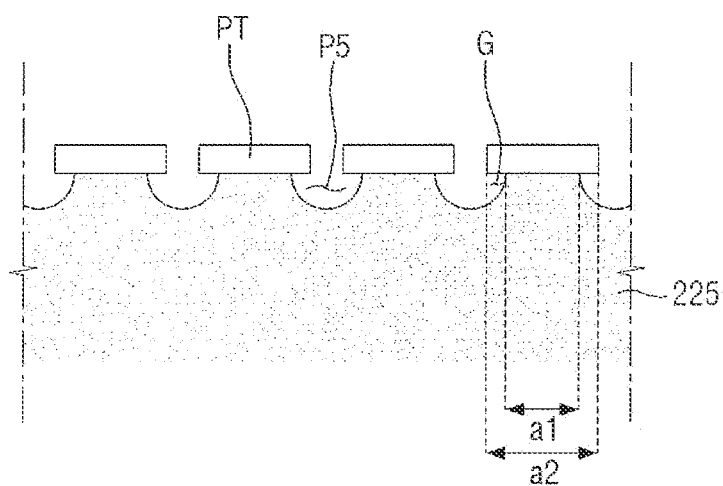
FIG. 21 illustrates a cross-sectional view along line XXI-XXI' in FIG. 20.

FIG. 19 is a cross-sectional view of another embodiment of an organic light emitting display device. FIG. 20 illustrates an enlarged view of a surface of a pixel defining layer 225 of the organic light emitting display device illustrated in FIG. 19. FIG. 21 illustrates a cross-sectional view taken along line XXI-XXI' in FIG. 20. In FIGS. 19, 20, and 21, structures of a bank and an organic film pattern of the organic light emitting display device are illustrated. Moreover, the embodiments in FIGS. 19, 20, and 21 are the same as in FIGS. 3, 4, and 5, except that inner holes are not formed in the pixel defining layer 225 and that a fine pattern layer PT is on the surface of the pixel defining layer 225.

Referring to FIGS. 19, 20, and 21, the organic light emitting display device further includes the fine pattern layer PT on the pixel defining layer 225 and in contact with the surface of the pixel defining layer 225. The fine pattern layer PT may be a layer having micro- or nano-scale patterns regularly arranged at predetermined intervals. The fine patterns of the fine pattern layer PT may be arranged, but not necessarily, in a matrix or stripe shape as illustrated in FIG. 20 when seen from above.

The surface of the pixel defining layer 225 may be in contact with the fine pattern layer PT and may include fine holes P5. In one embodiment, each of the fine holes P5 may be shaped like a valley extending between adjacent fine patterns PT. The fine holes P5 may have a different shape in another embodiment.

The area a1 of a portion of the fine pattern layer PT which is in contact with the pixel defining layer 225 may be smaller than the total area a2 of a surface of the fine pattern layer PT which faces the pixel defining layer 225. This may result in the formation of an area where some space G in each of the fine holes P5 overlaps a fine pattern PT. Even in this case, since the entrance of each of the fine holes P5 is narrow, air or a gas may be effectively accommodated in each of the fine holes P5.

The fine pattern layer PT may include an inorganic material. For example, the fine pattern layer PT may include one or more of, but not limited to, silicon oxide ($Si_xO_y$); silicon nitride ($Si_xN_y$) and silicon oxynitride ($Si_xO_yN_z$), where x, y and z are positive integers and may have values that make the silicon oxide, the silicon nitride and the silicon oxynitride have chemical feasible formulas.

FIGS. 22-30 are cross-sectional views illustrating stages of another embodiment of a method for manufacturing an organic light emitting display device, which, for example, may be the organic light emitting display device of FIG. 19.

Figure 22:
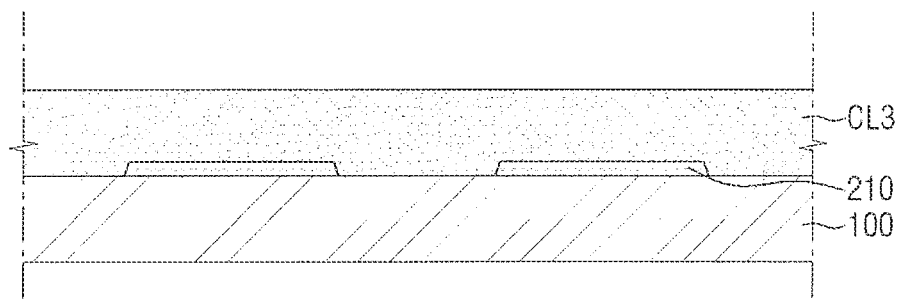
FIGS. 22-30 illustrate stages of another embodiment of a method for manufacturing an organic light emitting display device.

Referring to FIG. 22, a base substrate 100 and a first electrode 210 are formed in the same manner as in FIG. 11. Then, a second photoresist layer CL3 is formed on the base substrate 100, The second photoresist layer CL3 may be formed to completely cover the first electrode 210, like the first photoresist layer CL1 of FIG. 11. However, unlike the first photoresist layer CL1, the second photoresist layer CL3 may not include inorganic particles having micro- or nano-scale inner holes.

Figure 23:
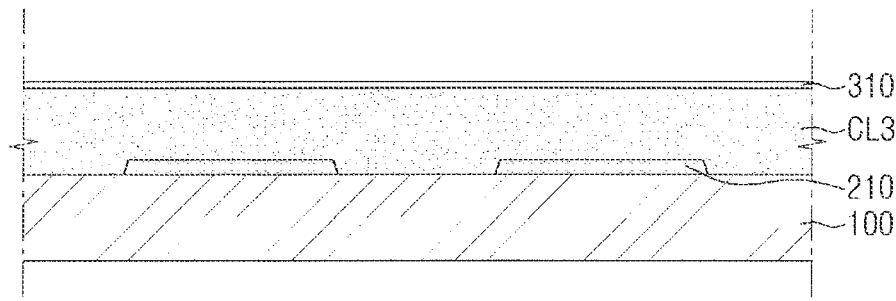

Referring to FIG. 23, an inorganic layer 310 is formed on the entire surface of the second photoresist layer CL3. The inorganic layer 310 may contain an inorganic material and, for example, may include one or more of silicon oxide, silicon nitride and silicon oxynitride. Since the inorganic material has light-transmitting properties, the inorganic material layer 310 may be formed to be transparent.

Figure 24:
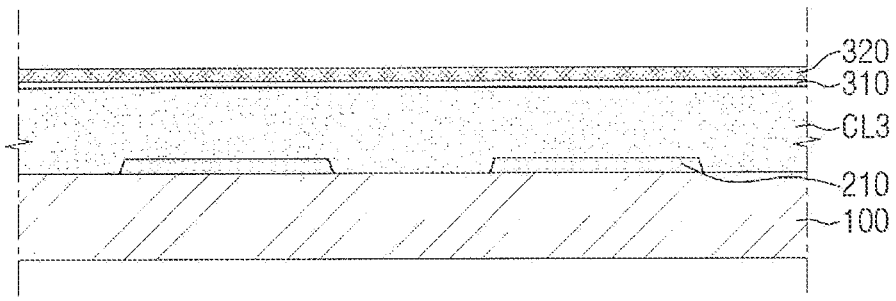

Referring to FIG. 24, a third photoresist layer 320 is formed on the entire surface of the inorganic layer 310.

Figure 25:
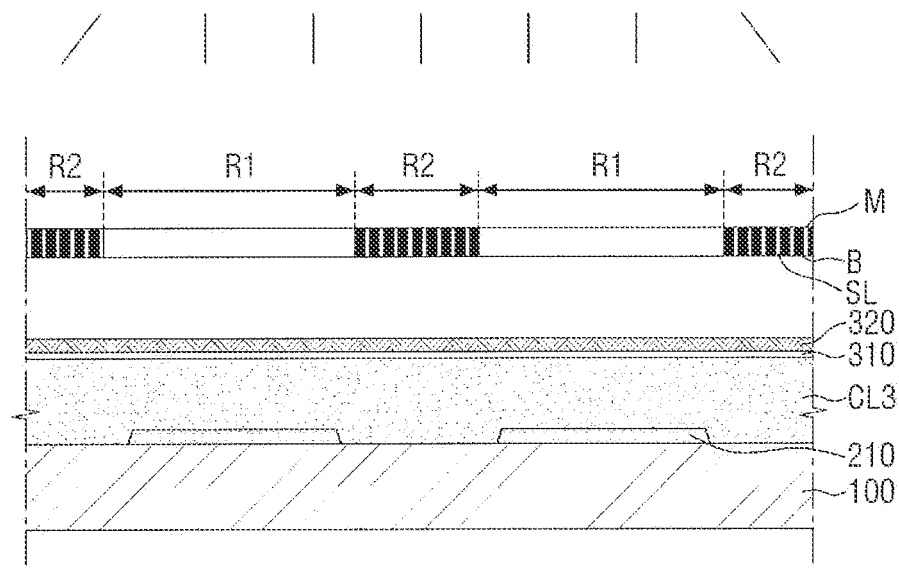

Referring to FIG. 25, the third photoresist layer 320 is exposed through a mask M having a light shielding pattern. The mask M may include a first region R1 corresponding to the first electrode 210 and a second region R2 around the first region R1. The first region R1 does not include light shielding portions B. The second region R2 includes the light shielding portions B formed in a predetermined pattern and slits SL where the light shielding portions B are not formed. Accordingly, light incident on the first region R1 may pass through the first region R1 as is, and light incident on the second region R2 may pass through only the slits SL.

Light passing through the first region R1 is provided to an area corresponding to the entire first region R1 of the third photoresist layer 320. Light passing through the second region R2 is provided to an area corresponding to each slit SL of the second region R2 of the third photoresist layer 320.

Since the inorganic layer 310 has the light-transmitting properties, light passing through the third photoresist layer 320 can reach the second photoresist layer CL3 under the inorganic layer 310. The slits SL of the second region R2 may be formed in a halftone manner to reduce the degree of light transmission. Accordingly, it is possible to prevent portions of the second photoresist layer CL3 corresponding to the slits SL from being removed in the development operation of the second photoresist layer CL3.

The light shielding portions B of the second region R2 may be arranged in a predetermined (e.g., checkerboard or matrix) pattern when seen from above. Accordingly, fine patterns PT may be arranged in a matrix shape. In another embodiment, the light-shielding portions B may be arranged in a stripe pattern or another pattern.

Figure 26:
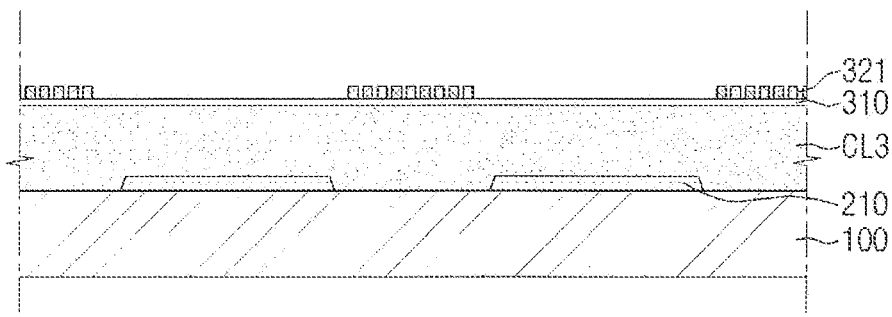

Referring to FIG. 26, the third photoresist layer 320 is developed to form a third photoresist pattern 321. The third photoresist pattern 321 may have patterns corresponding to the light shielding portions B of the mask M.

Figure 27:
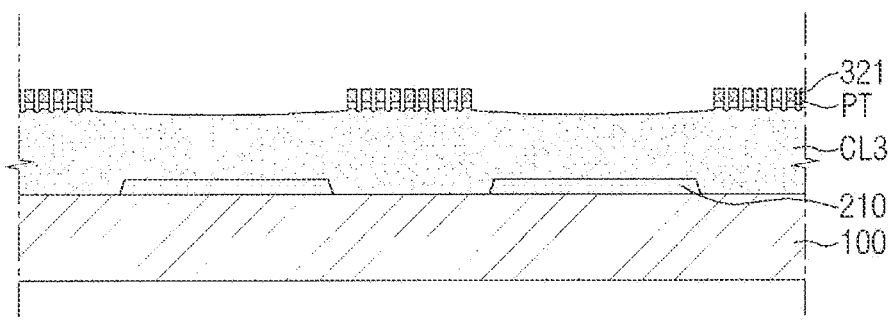

Referring to FIG. 27, the inorganic layer 310 is etched to form the fine patterns PT. An etching gas passing through a gap between the fine patterns PT may partially etch the surface of the second photoresist layer CL3, thereby forming fine holes P5.

The second photoresist layer CL3 may be etched to a greater degree than the fine patterns PT. Accordingly, as illustrated in FIG. 21, the fine holes P5 may be dug deeper into a pixel defining layer 225 than the fine patterns PT. For example, the area a1 of a portion of the fine pattern layer PT which is in contact with the pixel defining layer 225 may be smaller than the total area a2 of a surface of the fine pattern layer PT which faces the pixel defining layer 225. The fine patterns PT may correspond to the light shielding portions B of the mask M and the third photoresist pattern 321.

The etching method may be, for example, a dry etching method. A different etching method may be used in another embodiment.

Figure 28:
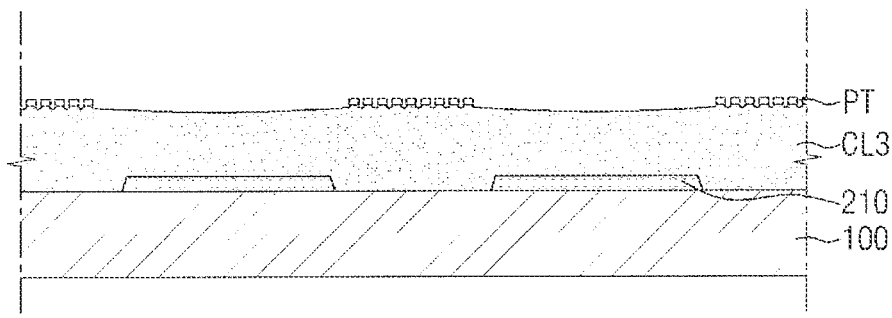

Referring to FIG. 28, the third photoresist pattern 321 is stripped and removed. The third photoresist pattern 321 may be removed by, but not limited to, a lift-off method using a stripper.

Figure 29:
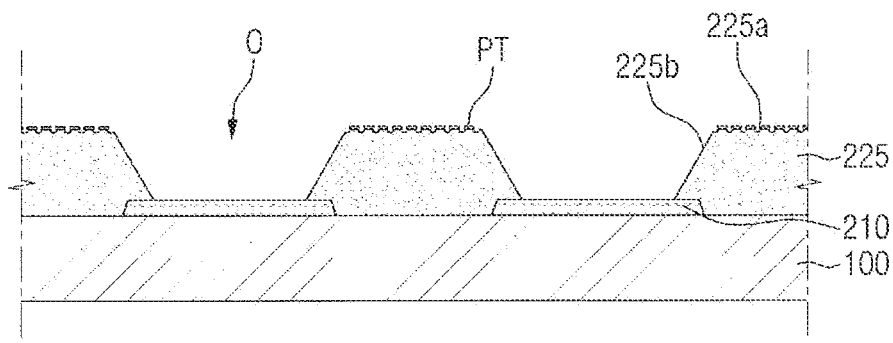

Referring to FIG. 29, the second photoresist layer CL3 is developed to form the pixel defining layer 225. Since the second photoresist layer CL3 is also exposed to light passing through the transparent inorganic layer 310 in the exposure operation of the third photoresist layer 320, it may be developed without further exposure.

In addition, when the slits SL of the mask M are formed in a halftone manner as described above, it is possible to prevent portions of the second photoresist layer CL3 corresponding to the slits SL from being removed in the exposure operation of the third photoresist layer 320.

Figure 30:
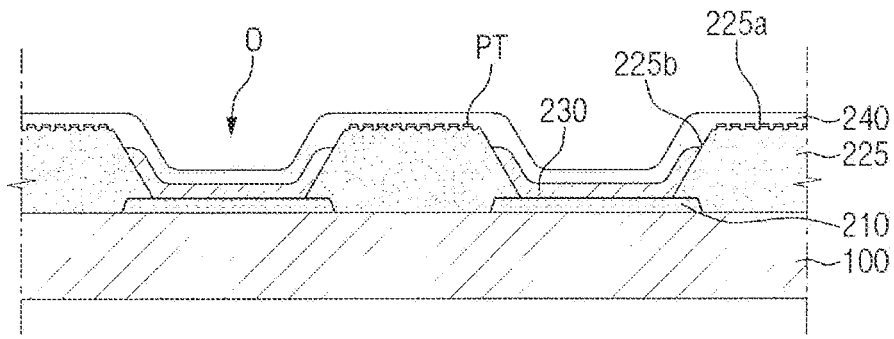

Referring to FIG. 30, an organic ink is ejected onto the first electrode 210 in the opening O of each pixel and then dried to form an organic layer 230. After that, a second electrode 240 is formed on the organic layer 230 and the pixel defining layer 225 to produce the organic light emitting display device illustrated in FIG. 19.

In accordance with one or more of the aforementioned embodiments, fine holes or fine patterns are formed on the surface of a pixel defining layer to make the surface of the pixel defining layer super-repellant. Accordingly, an organic ink containing an organic light emitting material may be controlled easily. Further, process costs may be reduced because a low concentration of organic ink can be utilized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method of manufacturing a display device, the method comprising:
   forming an electrode on a base substrate;
   forming a photoresist pattern on the base substrate, the photoresist pattern including a plurality of inorganic particles having inner holes and an opening exposing at least a portion of the electrode; and
   forming a plurality of fine holes on a surface of the photoresist pattern by partially removing inorganic particles in the surface of the photoresist pattern, wherein partially removing the inorganic particles includes etching a surface of the photoresist pattern using a fluorinated gas to expose the inner holes in the inorganic particles.

2. The method as claimed in claim 1, wherein the inorganic particles include at least one of silica ($SiO_2$), alumina ($Al_2O_3$), or zinc oxide (ZnO).

3. The method as claimed in claim 1, wherein the surface of the photoresist pattern includes a fluoro group.

4. The method as claimed in claim 1, wherein a cross-section of at least one of the fine holes includes a portion of a circular shape.

5. The method as claimed in claim 1, further comprising:
   ejecting an organic ink onto the electrode exposed by the opening, the organic ink including an organic light emitting material; and
   forming an organic layer by drying the ejected organic ink.

6. The method as claimed in claim 1, further comprising:
   removing residues of the photoresist pattern on the electrode through plasma ashing before etching the surface of the photoresist pattern using the fluorinated gas after the forming of the photoresist pattern.

* * * * *